United States Patent
Hsu et al.

(10) Patent No.: US 6,930,385 B2
(45) Date of Patent: Aug. 16, 2005

(54) CASCADED DIE MOUNTINGS WITH SPRING-LOADED CONTACT-BOND OPTIONS

(75) Inventors: John S. Hsu, Oak Ridge, TN (US); Donald J. Adams, Knoxville, TN (US); Gui-Jia Su, Knoxville, TN (US); Laura D. Marlino, Oak Ridge, TN (US); Curtis W. Ayers, Kingston, TN (US); Chester Coomer, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 10/738,746

(22) Filed: Dec. 17, 2003

(65) Prior Publication Data

US 2004/0164432 A1 Aug. 26, 2004

Related U.S. Application Data

(60) Provisional application No. 60/435,564, filed on Dec. 20, 2002, and provisional application No. 60/435,157, filed on Dec. 20, 2002.

(51) Int. Cl.[7] .............................................. H01L 23/34
(52) U.S. Cl. ........................ 257/714; 257/716; 257/719
(58) Field of Search ................................ 257/714, 716, 257/719, 712, 704, 686, 698, 700

(56) References Cited

U.S. PATENT DOCUMENTS

| | | |
|---|---|---|
| 5,345,365 A | 9/1994 | Herndon et al. |
| 5,604,377 A * | 2/1997 | Palagonia ................... 257/685 |

OTHER PUBLICATIONS

Stacked Die Ball Grid Array: SDBGA, SDBGA–SS ST Assembly Test Services Ltd. (Sep. 2003).
TESSERA—Tessera's Unique Approach to Stacked IC Packaging p. 1–4.
Importance of Packaging in Power Electronics Chapter I Introduction, p. 1–12.
Amkor Technology, Enabling Technologies, Flip Chip Packaging, Technology Solution, http//www.amkor.com/enablingtechnologies/FlipChip/Index.cfm.
Wen, Sihua, Thermal and Thermo–Mechanical Analyses of Wire Bond vs. Three–dimensionally . . . , Dec. 1999, Virginia Polytechnic Institute and State University, pp. 1–87.
Wen, Simon, A Dimple–Array Interconnect Technique for Power Semiconductor Devices, Power Electronics Packaging Lab, Blacksburg, VA, USA.
MORRISON, Dual Thermal Paths Double Power Handling for Surface–Mount MOSFETs, Electronic Design, Jan. 2002.
Speed, et al., New Power MOSFET Packages Cut DC—DC Converter Size, Power Electronics Technology, Jun. 2001. http://scholar.lib.vt.edu/theses/available/etd–0106100–113320/unrestricted/ChpI.pdf.
Xiao, et al., Flip–Chip Flex–Circuit–Packaging for 42V/16A Integrated Power Electronics Module Applications, Center for Power Electronics Systems, Troy, NY, USA.

* cited by examiner

Primary Examiner—Eddie Lee
Assistant Examiner—Douglas W. Owens
(74) Attorney, Agent, or Firm—Kirk A. Wilson

(57) ABSTRACT

A cascaded die mounting device and method using spring contacts for die attachment, with or without metallic bonds between the contacts and the dies, is disclosed. One embodiment is for the direct refrigerant cooling of an inverter/converter carrying higher power levels than most of the low power circuits previously taught, and does not require using a heat sink.

14 Claims, 8 Drawing Sheets

CASCADED DIE MOUNTINGS WITH SPRING-LOADED CONTACT-BOND OPTIONS

CROSS-REFERENCE TO RELATED APPLICATIONS

This application claims priority to U.S. Provisional Patent Applications 60/435,564, filed Dec. 20, 2002, and 60/435,157, filed Dec. 20, 2002, both herein incorporated by reference.

STATEMENT REGARDING FEDERAL SPONSORSHIP

This invention was made with Government support under contract no. DE-AC05-00OR22725 to UT-Battelle, LLC, awarded by the United States Department of Energy. The Government has certain rights in the invention.

TECHNICAL FIELD

The present invention relates to methods and apparatus for interconnecting and packaging miniature electronic components, such as integrated circuit chips and other devices to form larger systems. This invention recognizes that cooling of power electronic dies by a liquid refrigerant no longer restricts packaging arrangements. These packaging innovations do not require flat cooling surfaces previously necessary for achieving a low thermal resistance connection to the heat sink.

DESCRIPTION OF THE BACKGROUND ART

Methods of cascading semiconductor die have been in use in the semiconductor industry since the 1990s. This technology has been primarily used for memory chips in computer systems. With increasing trends towards systems on chips this packaging methodology is rapidly expanding into other applications. Stacking of semiconductor die is ideal for low current, low power systems. Thermal considerations have prevented these packaging methods from being used for higher power devices.

Typical IGBT (Insulated Gate Bipolar Transistor) module die arrangements have the dies attached to copper which is bonded to a ceramic backplate. The heat generated by the dies is transferred through the ceramic to the heat sink located under the backplate. Bonded wires are used for electrical connection between the dies and electrodes. The connection wires are encased in a podding gel for insulation, thermal transfer, and mechanical stability purposes. Thermal resistance along the heat transfer path makes the junction temperature higher than it would be for a directly liquid cooled arrangement.

With dies stacked, the small die resides atop the larger and wire bonds are brought out to either the substrate or a lower level die. This method can be expanded to larger numbers of layers. Using several layers of die, the topmost layer has two separate dies sitting on the layer beneath it. Cascading die in this manner results in increases in packing density, reductions in cost, less inductance, and faster signal transmissions because the dies are closely stacked. Most stacking methods still rely on wire bonds for bringing the I/O from the outside world to the silicon.

Within the semiconductor packaging industry there is a growing desire to move away from the wire bonding of the die to the substrate or output pins. Size, performance, and cost considerations are driving new packaging methods. This is true for low as well as high power devices.

Silicon Power Corporation is developing a new packaging method for power devices. The wire-bondless package is a soldered assembly of a semiconductor power device, such as an IGBT, and a thin ceramic lid. The lid is metalized on the bottom side and designed to mate to large and small device electrodes, which are connected by metalized vias to a more rugged and convenient pattern of top-side metal. If the lid material is a good conductor and/or if the lid vias are very dense, the ThinPak lidded device can be cooled from both sides or treated as a flip chip device, but without the usual limitations in achievable breakdown voltage. The low impedance and small size and weight of the device, as well as the rather large mechanical tolerances of the lid, make it convenient for module applications.

The thin-film power overlay (POL) technology developed at General Electric is an approach to reducing the cost of mass production and improving the reliability and efficiency of power electronics packages. Power semiconductor devices are soldered to a Direct Bonded Copper (DBC) substrate from the backside. Differences in device thickness are compensated by copper shims. A thin layer of polyamide sheet is laminated over the die after vias are laser machined or mechanically punched through the film. These vias provide openings for the power interconnect to the top layer. The whole top surface is then metallized (electro-plated) with copper. Circuit patterns are achieved by the application of photo resist and chemical etching processes. More layers can be built up repeatedly to realize a multilayered interconnect structure. Low-profile passive components can be embedded into the overlay flex.

Dimple Array Interconnect (DAI) packaging involves the use of a copper sheet with arrays of dimples preformed serving as electrical interconnections. The Dimple Array Interconnect structure has similar shape as the hourglass-shaped flip chip interconnect.

International Rectifier's DirectFET is a surface-mount package that improves MOSFET performance by lowering both the package's electrical and thermal resistance. It does so with a design that permits direct attachment of the die to the pc board via solderable pads on the chip and through attachment to a copper drain clip that allows double-sided cooling. The DirectFET package comprises a passivated die attached to a copper clip. Solderable metal contacts on the bottom of the die provide gate and source contacts to the pc board, while the copper clip provides an electrical connection to the drain and permits topside cooling. Although the package has the same outline as an SO-8, the DirectFET's height is 60% less.

In Vishay Siliconix's PowerConnect technology, traditional bondwires are replaced with a direct connection between the MOSFET die and the copper leadframe to lower a package's contribution to the device's on resistance, $R_{DS(on)}$ in low-voltage power MOSFETs. To accomplish this direct connection, the top surface of the MOSFET die had to be made solderable. Toward that end, the company developed a nickel-based metallization process on top of the aluminum. The result is that the leadframe can be attached to both the bottom and the top surface of the die.

Semikron is making baseless IGBT power modules based on pressure contact packaging technology through the use of a spring pad and a pressure plate. The elimination of the base plate and thus the solder joint between the base plate and substrate, together with the use of spring contacts to establish connections between the built-in gate drive board and the substrate, leads to improved reliability and enables a very cost effective module and power electronic system assembly. Semikron packaging is designed for traditional heat-sink cooling and is not applicable to direct refrigerant cooling. The chips are cooled by a heat sink.

Virginia Polytechnic Institute and State University disclosed a three-dimensional packaging technique developed for power electronics building blocks using direct copper bonding to interconnect power devices. The parallel-plate structure provides the potential for double-sided cooling, direct liquid cooling of the power devices between the plates, and integration of passive components in the module.

FlipChip technology uses a ball grid array package resulting in a wire bondless system. The interconnection between the die and carrier in flip chip packaging is made through a conductive "bump" that is placed directly on the die surface. The bumped die is then "flipped over" and placed face down, with the bumps connecting to the carrier directly. After the die is soldered, underfill is added between the die and the substrate. Underfill is a specially engineered epoxy that fills the area between the die and the carrier, surrounding the solder bumps. It is designed to control the stress in the solder joints caused by the difference in thermal expansion between the silicon die and the carrier. Once cured, the underfill absorbs the stress, reducing the strain on the solder bumps, greatly increasing the life of the finished package. The chip attach and underfill steps are the basics of flip chip interconnect A flex-circuit interconnection system is being developed at the Center for Power Electronics Systems at Rensselaer Polytechnic Institute. This method offers extra layout design freedom in the vertical dimension of the package. Compared with the conventional power module, the power terminals in the flex-circuit package are distributed on the DBC and the flex substrate with close proximity and planar configuration. As a result, the package parasitic inductance can be reduced significantly.

SUMMARY OF THE INVENTION

A cascaded die mounting device and method using spring contacts for die attachment, with or without metallic bonds between the contacts and the dies, is disclosed. One embodiment is for the direct refrigerant cooling of an inverter/converter carrying higher power levels than most of the low power circuits previously taught, and does not require using a heat sink. The invention is an interconnect and mounting device comprising at least three cascaded layers of electronic components, a means for electrically interconnecting said layers at contact points, a means for connecting input power to said device, a means for connecting output power to said device, wherein said components modify said input power to produce said output power, and wherein said components are cooled by direct refrigerant contact.

DETAILED DESCRIPTION

Figure 1:
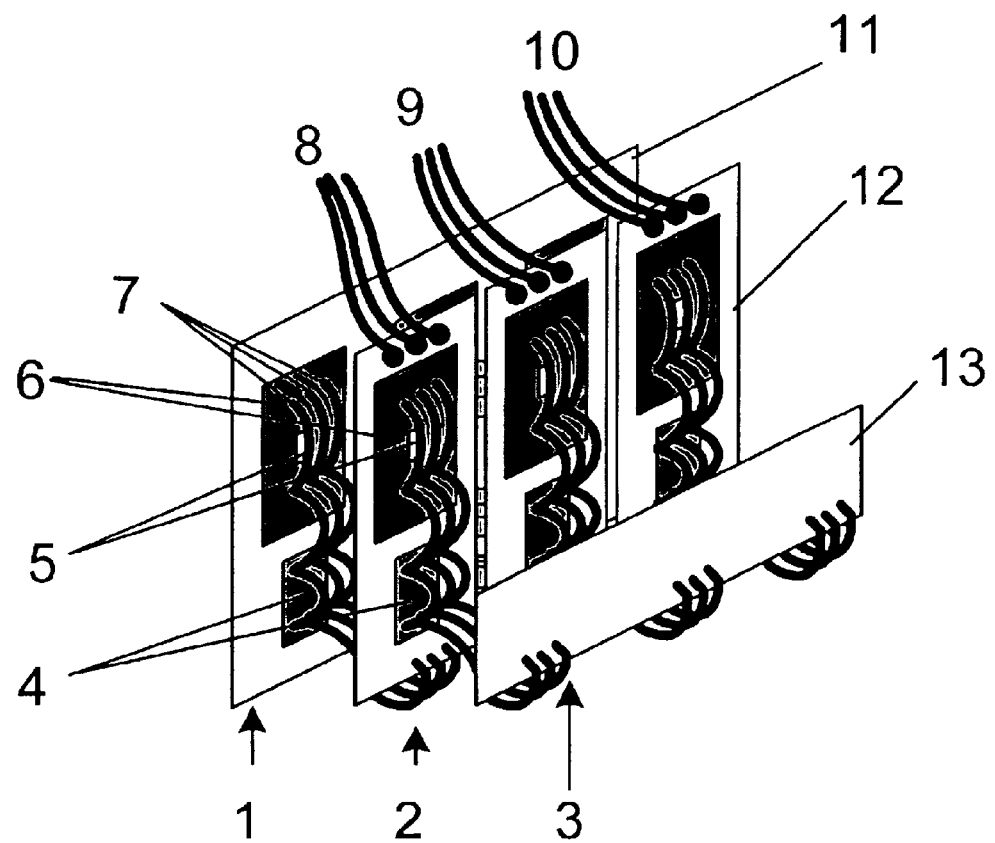
FIG. 1 is a diagram of a basic cascaded mounting arrangement with example wirebonds.

FIG. 1 shows a basic cascaded mounting embodiment. Three layers are shown but the invention is not limited to a specific number of layers. Beginning with the first layer 1, a metal such as copper alloy with other appropriate thermal expansion controlling material such as a piece of ceramics, carbon foam, or low expansion alloy to form a direct metal bond substrate is used as a conducting plate 11. Optional features such as modifying the conducting plates 11, 12, 13 with an array of small holes that enable an array of thin wires going through the thermal expansion controlling material, resulting in another option of matching thermal expansion with the dies. The semiconductor switches 6 and diodes 4 dies are metallically bonded to a surface of the conducting plate 11 to form the first layer 1. The semiconductor switches can have built-in diodes. Wirebonds 7 are used at interconnecting wiring contact points. The second layer 2 comprises three separate small conducting plates 12. One surface of each small conducting plate 12 has a set of a switch 6, and a diode 4 metallically bonded to it. Each three-phase power leg 8, 9, and 10 is connected to a separate small conducting plate 12. The third layer is a conducting plate 13. The three plates are mounted in a cascaded form with sufficient spacing between the layers for liquid refrigerant to flow through and for bubbles formed by refrigerant nucleate boiling to be rapidly expelled by the moving liquid refrigerant.

Figure 2:
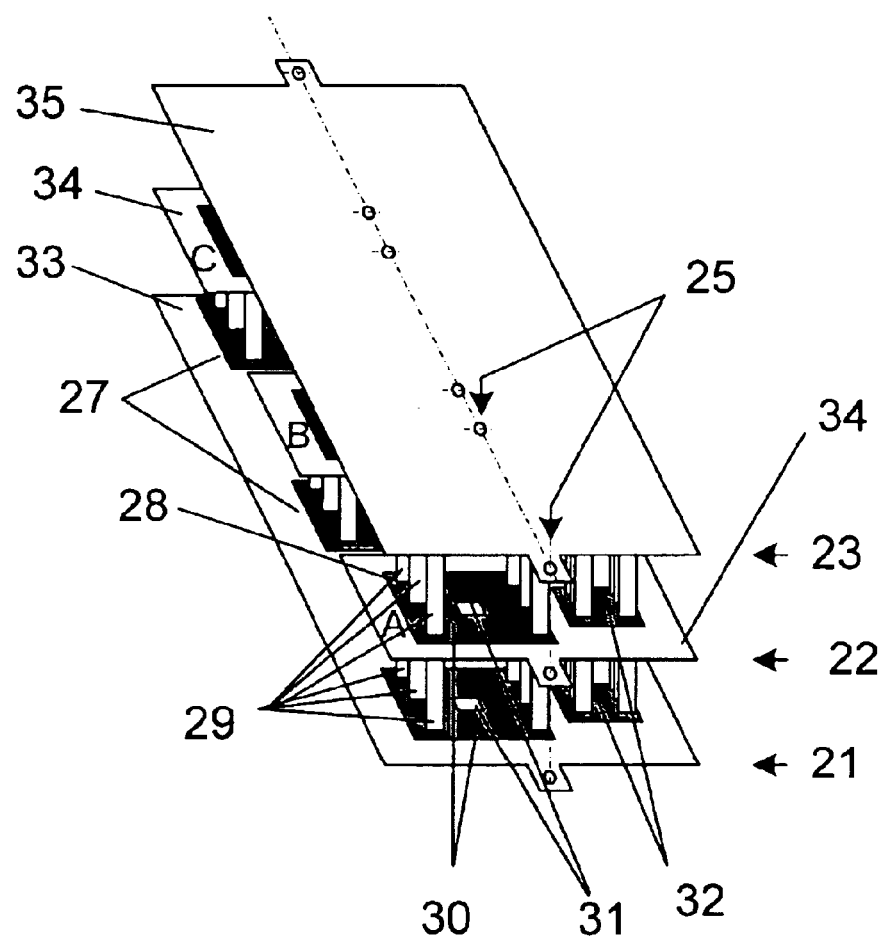
FIG. 2 is a diagram of a basic cascaded mounting arrangement with example spring-loaded contacts with or without metallic bonds.

FIG. 2 shows the basic cascaded mounting embodiment with spring-loaded contacts 29. There are three cascaded layers 21, 22, 23. On the first layer 21, the dies of switches 30 and diodes 32 are placed on a thermal expansion controlled conducting plate 33 to form the first layer 21. Bonding material can be distributed on the conducting plate 33 prior to component placement. The second layer 22 comprises three separate small conducting plates 34. On the lower surface of each small conducting plate 34, a sufficient number of fine spring-loaded contacts 29 are disposed between each small conducting plate 34 and a switch 30/diode 32 on the upper surface of the first layer 21. There can be bonding material distributed on the small conducting plates 34 prior to assembly. The number of spring-loaded contacts 29 is determined by the permissible current density of the contacts and the required distribution on the die 30. The upper surface of each small conducting plate 34 has a switch 30/diode 32 disposed on the upper surface with or without use of a bonding material. The third conducting plate 35 has spring-loaded contacts 29 disposed between the lower surface of the third conducting plate 35 and each switch 30/diode 32 on the second layer 22. The spring-loaded contacts 29 supply contact pressure between each switch 30/diode 32 and its respective conductive plate mounting. The three layers are assembled together under a predetermined spring load.

Optionally, metallic bonding of the sufficient number of fine spring-loaded contacts 29 to its respective switch 30/diode 32 is used. The reasons for sufficient number of fine contacts are to carry sufficiently high current and not to post thermal expansion stress on the dies. There must be sufficient clearance to perform metallic bonding once the layers are assembled. For example, metallic bonding could be performed using a multiple-finger ultrasonic bonding head to create metallic bonds between the spring-loaded contacts 29 and switches 30 or diodes 32. Alternatively, a laser could be utilized for the multiple-finger bonding. Another option would be placing the assembly in an oven under proper environment control to bond the switches 30 and diodes 32 to the fine spring-loaded contacts. It would be necessary to ensure the oven's operating temperature did not exceed the temperature specifications of the switches 30 and diodes 32.

There are many possible methods for assembling the conducting plates. The distance between the layers is determined by (1) the required spring loads for the proper operation of the contacts, (2) the clearance for a self adjustment of the spring loads, (3) the sufficient clearance available between the layers for the liquid refrigerant to flow and for the bubbles to be rapidly expelled by the moving liquid refrigerant, (4) the mechanical integrity of the mounting structure, and (5) the tolerable maximum stray inductance of the spring contacts for specific applications. As an example, the mounting can be a structure comprises two or more insulation bolts 25 per small conducting plate. Each bolt penetrates the three layers with given insulation spacers situated between the layers for a predetermined spring load. Nuts at an end of the insulation bolt 25 can be used to draw the conducting plates together. Other mounting parts determined by specific application can be used for assembly.

Figure 3:
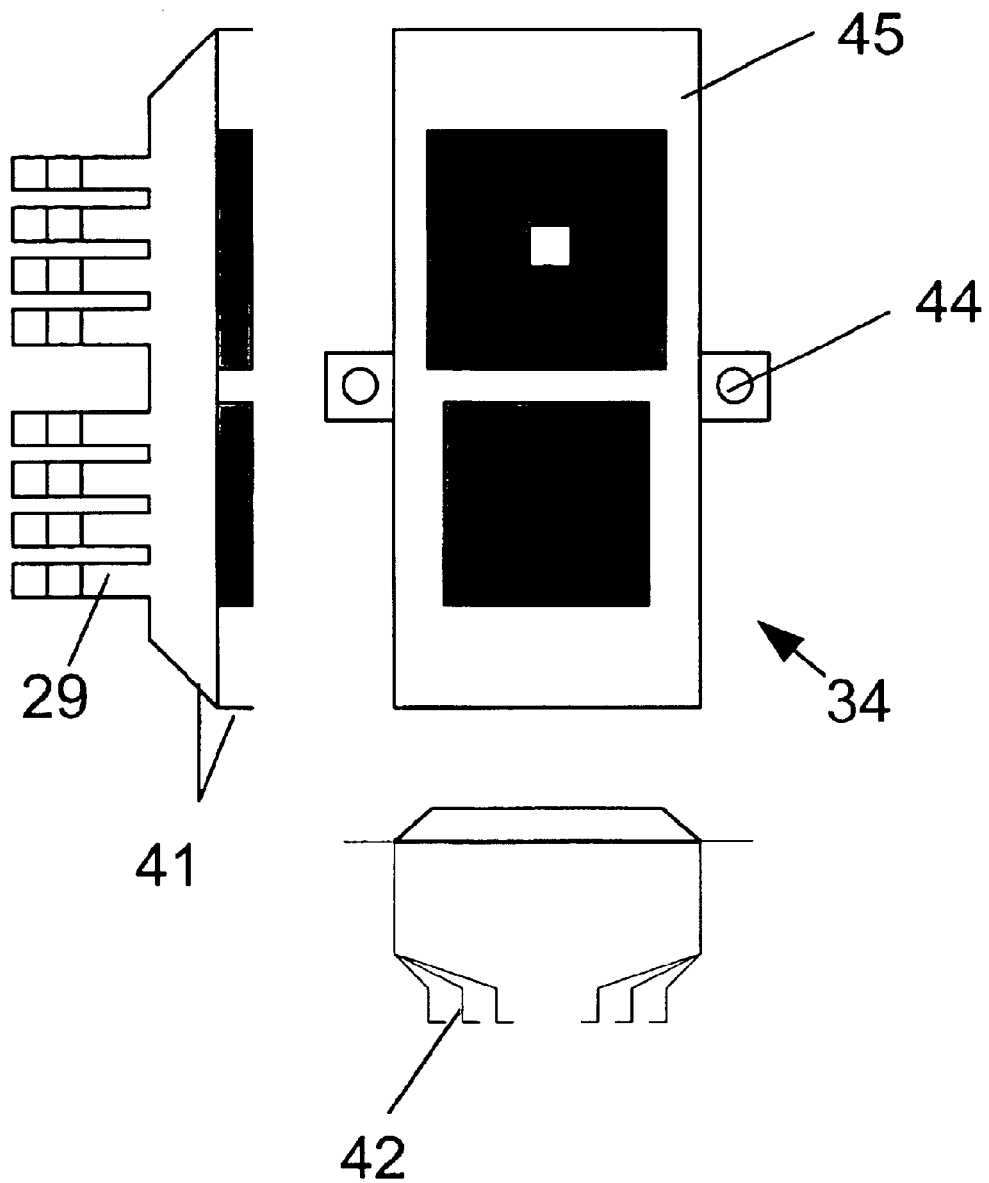
FIG. 3 is a diagram of example spring contacts arrangement on a layer.

FIG. 3 illustrates three views of a small conducting plate 34 using spring-loaded contacts 29 with or without metallic bonds. The spring-loaded contacts 29 are extended out from the copper alloy of the conducting plate 45. Bonding material can be distributed on the conducting plate 45 prior to assembly. Only if needed the edges 41 of the copper alloy plate may be folded to increase the rigidity during manufacturing process. Each individual spring of the spring-loaded contact 29 can be self adjusted by the bending of their spring arms 42. An assembly guide 44 is included to allow the small conducting plate 34 sufficient freedom of movement for the self-adjustment of the spring load in the spring-loaded contacts 29. A three-layer assembly similar to that shown in FIG. 2 can be fabricated using this technique. The fine spring-loaded contacts 29 can be constructed with metallic bonds using (a) multiple-head ultrasonic bonding techniques, (b) laser bonding, or (c) oven bonding.

Figure 4:
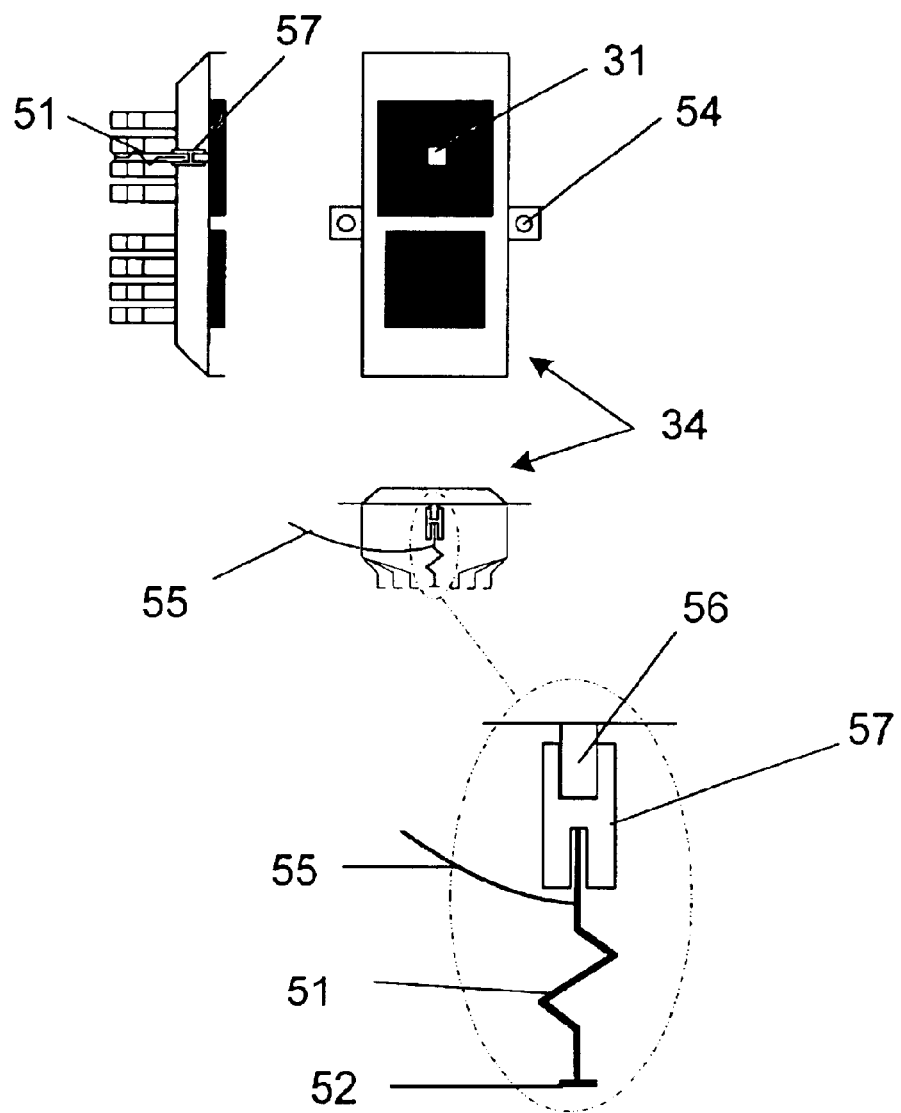
FIG. 4 is a diagram of example spring-loaded isolated contact-bond arrangement

FIG. 4 shows an insulated holder 57 attached to a stamped tab 56 to extend a spring contact 51 to the gate 31 of a switch 30 or other isolated points. A conductive lead 55 for bringing out the gate control can be attached to the spring contact 51. Since all spring contacts 51 are precisely located after the cascaded mounting is assembled, it is possible to incorporate a reasonably simple step to bond the spring contacts 51 to a gate 31 or other isolated points with a bonding material 52. Bonding will prevent fatigue of the springs.

Figure 5:
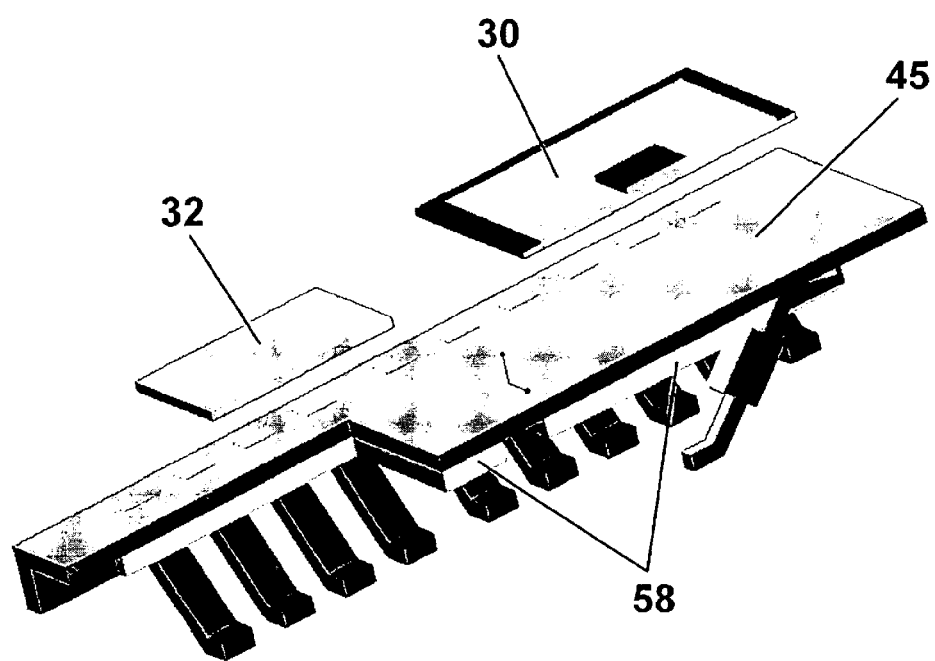
FIG. 5 is a diagram of a cascade silicon die mounting to a solid conducting plate.

FIG. 5 shows the silicon switch 30 and diode 32 dies in position to mount directly onto the conducting plate 45 with the thermal expansion controlling material 58 bonded to the back side of the conducting plate 45 to thermally stabilize the plate and decrease thermal stress on the silicon die. The thermal expansion controlling material 58 can be a ceramic, low expansion metal, graphite foam, or other suitable material.

Figure 6:
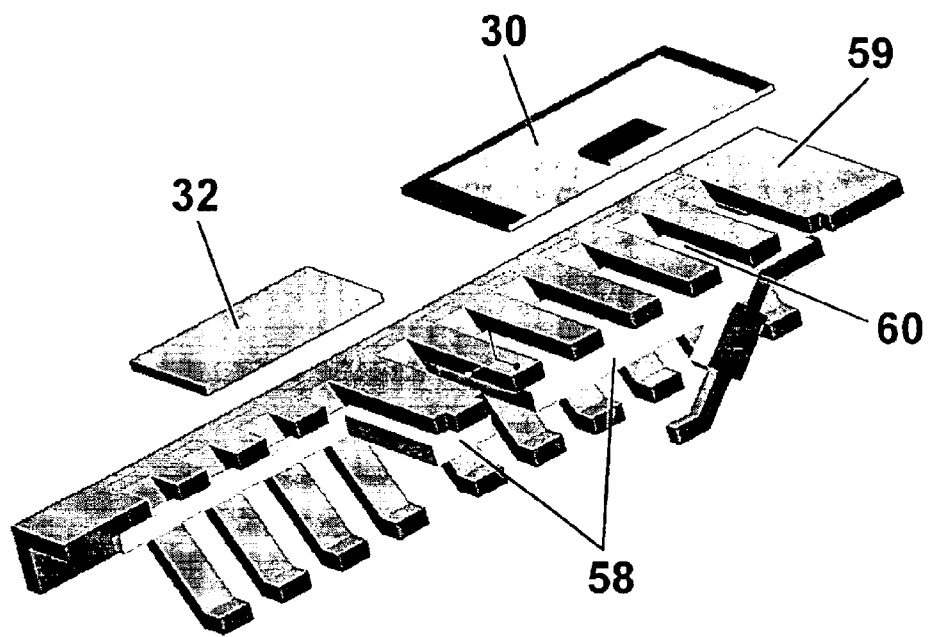
FIG. 6 is a diagram for a slotted geometry cascade silicon die mounting.

FIG. 6 shows the silicon switch 30 and diode 32 dies in position to mount onto a slotted conducting plate 59 with the thermal expansion controlling material 58 bonded to the back side of the slotted conducting plate 59 to thermally stabilize the plate and decrease thermal stress on the silicon die. Various slot geometries 60 can be used to match thermal growth of the silicon dies 30, 32 to the slotted conducting plate 59. The thermal expansion controlling material 58 can be a ceramic, low expansion metal, graphite foam, or other suitable material.

Figure 7:
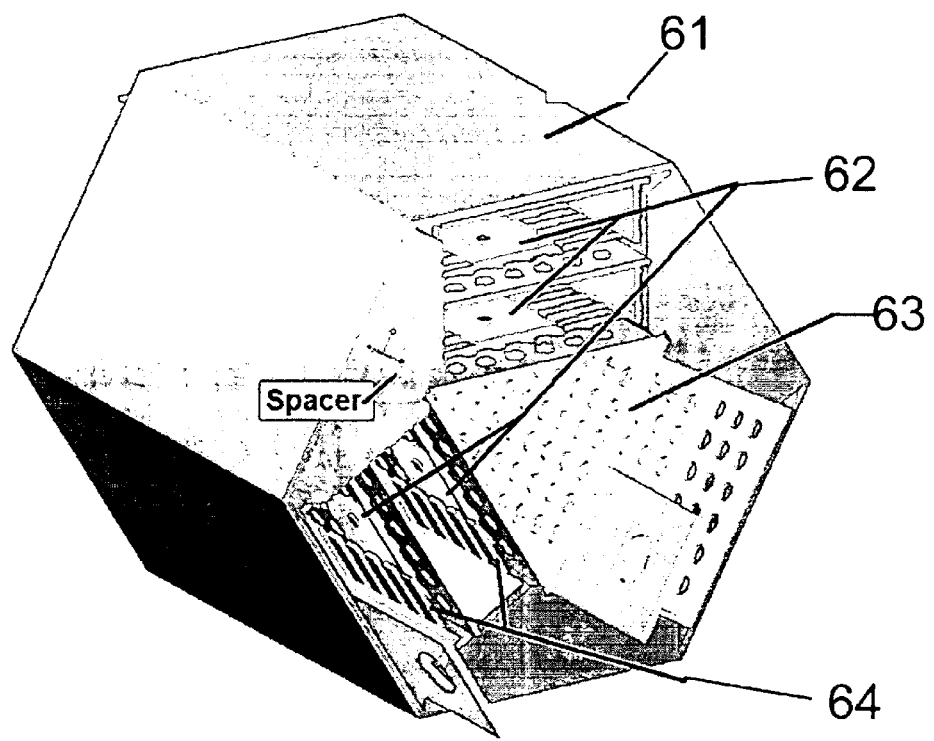
FIG. 7 is a diagram of a cascaded mounting arrangement having a triangular inner structure and a hexagonal outer structure.

FIG. 7 shows a three-phase, three-leg embodiment of the invention having semiconductor switches 62 cascade-mounted onto a triangular inner structure 63. The triangular inner structure 63 supports lower switches of the phase legs and also serves as a positive DC link terminal. Spring-loaded and soldered contacts 64 can be used in this embodiment. A hexagonal outer structure 61 also serves as a negative DC link terminal.

Figure 8:
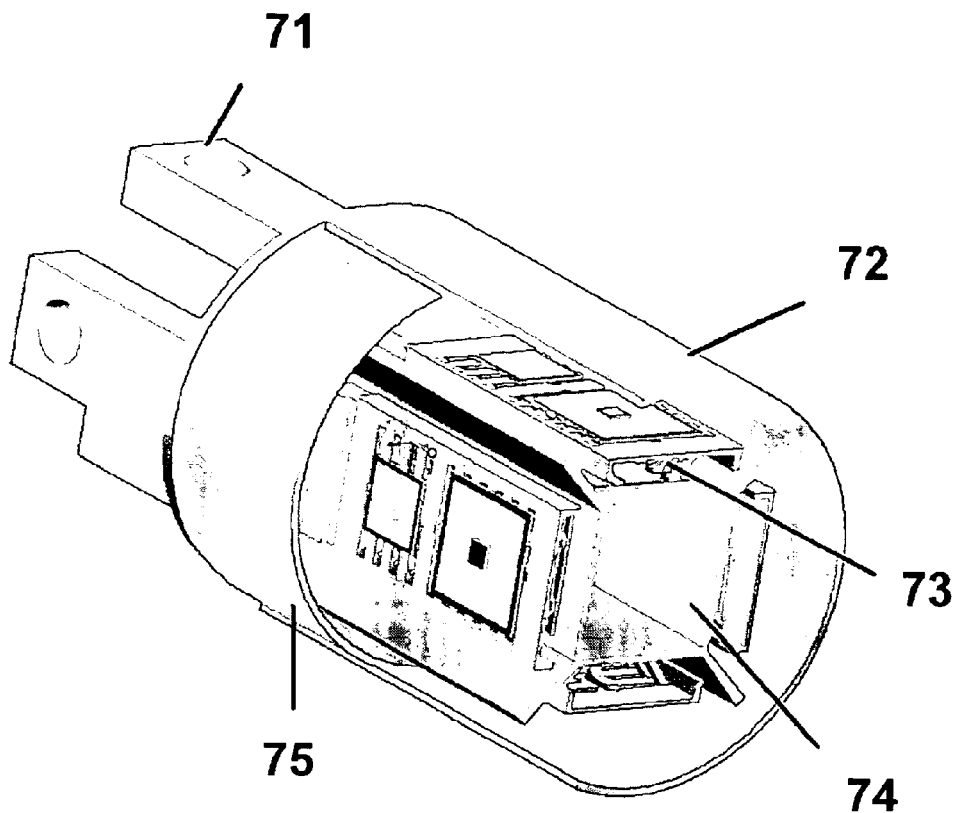
FIG. 8 is a diagram of a cascaded mounting arrangement having four legs.

FIG. 8 is a diagram of a four leg cascade inverter embodiment having four (4) copper conductor bars 71 for output connections supported, for example, on an insulated base behind the cascade mounts. The cascade segment 73 shows a two layer silicon die stack with the outer cylinder contacts not shown. The outer DC link cylinder 72 and the inner DC link 74 feed DC power to the silicon dies. The DC power is then modified by the silicon dies to produce AC power on the four output copper conductor bars 71. An insulating sleeve 75 is provided between the phases and DC link.

The embodiments shown are suitable for generating up to four-phase output power however two-phase or other number of phases output power is generated by providing additional legs in the device.

While there has been shown and described what are at present considered the preferred embodiments of the invention, it will be obvious to those skilled in the art that various changes and modifications can be made therein without departing from the scope.

We claim:

1. An interconnect and mounting device comprising;
    at least three cascaded layers of electronic components,
    a means for electrically interconnecting said layers at contact points,
    a means for connecting input power to said device,
    a means for connecting output power to said device,
    wherein said cascaded layers further comprise at least one conducting plate and at least one of said electronic components disposed on said conducting plate; said conducting plate further comprising a metal and a thermal expansion controlling material,
    wherein said components modify said input power to produce said output power, and
    wherein said components are cooled by direct refrigerant contact.

2. The device of claim 1 wherein said metal is a copper alloy.

3. The device of claim 1 wherein said thermal expansion controlling material is selected from the group consisting of ceramics, carbon foam, and low expansion alloy.

4. The device of claim 1 wherein said thermal expansion controlling material further comprises an array of small holes.

5. The device of claim 1 where said electronic components are metallically bonded to said conducting plate.

6. The device of claim 1 wherein said input power is DC and said output power is three-phase AC.

7. The device of claim 6 wherein each phase of said three-phase AC output power is connected to separate conducting plates on the same cascaded layer.

8. The device of claim 1 wherein said electronic components are selected from the group consisting of semiconductor switches, diodes, and semiconductor switches with built-in diodes.

9. The device of claim 1 wherein said means for electrically interconnecting said layers further comprises wirebonds.

10. The device of claim 1 wherein said means for electrically interconnecting said layers further comprises spring-loaded contacts having two ends.

11. The device of claim 10 wherein each end of said spring-loaded contacts is metallically bonded to a separate layer.

12. The device of claim 10 wherein said device further comprises at least one insulation bolt, nut, and spacer to mechanically interconnect said layers.

13. The device of claim 10 wherein said spring-loaded contacts are stamped out from the metal of said conducting plates.

14. The device of claim 10 wherein at least one of said spring-loaded contacts further comprises a conductive lead and an insulated holder disposed on a stamped tab to extend said spring-loaded contact.

* * * * *